(12) United States Patent
McCalmont

(10) Patent No.: US 6,822,480 B1
(45) Date of Patent: Nov. 23, 2004

(54) BI-DIRECTIONAL BUS LEVEL TRANSLATOR

(75) Inventor: Jonathan S. McCalmont, Ames, IA (US)

(73) Assignee: Micrel, Incorporated, San Jose, CA (US)

(*) Notice: Subject to any disclaimer, the term of this patent is extended or adjusted under 35 U.S.C. 154(b) by 0 days.

(21) Appl. No.: 10/654,283

(22) Filed: Sep. 2, 2003

(51) Int. Cl.$^7$ .......................................... H03K 19/0175
(52) U.S. Cl. .......................................... 326/81; 326/83
(58) Field of Search ...................... 326/37, 38, 80–83, 326/86, 89, 63, 68

(56) References Cited

U.S. PATENT DOCUMENTS

| | | | |
|---|---|---|---|
| 5,689,196 A | 11/1997 | Schutte | 326/86 |
| 5,877,633 A * | 3/1999 | Ng et al. | 326/80 |
| 6,232,818 B1 * | 5/2001 | Zaliznyak | 327/333 |
| 6,307,397 B1 * | 10/2001 | Mueller et al. | 326/81 |
| 6,552,568 B2 * | 4/2003 | Esch | 326/63 |
| 6,762,621 B1 * | 7/2004 | El-Ayat | 326/38 |

* cited by examiner

Primary Examiner—Don Le
(74) Attorney, Agent, or Firm—Patent Law Group LLP; Carmen C. Cook

(57) ABSTRACT

A circuit is provided to transfer data between a first data bus section operating on a first supply voltage and a second data bus section operating on a second, different supply voltage. The circuit includes a first circuit path and a second circuit path each coupled to receive a data signal from one data bus section and to drive the other data bus section. Each of the first and second circuit paths includes a delay circuit, a flip flop, a logic circuit providing an AND function and an output driver circuit. In operation, when the data signal received on one of the first and second data bus sections has a first logical value, an output driver signal of the respective circuit path is asserted and the output driver circuit drives the other data bus section to the first logical value in response to the output driver signal.

20 Claims, 2 Drawing Sheets

BI-DIRECTIONAL BUS LEVEL TRANSLATOR

FIELD OF THE INVENTION

The invention relates to data bus communication schemes and in particular, to a bi-directional bus level translator for connecting between data buses operating at different supply voltages.

DESCRIPTION OF THE RELATED ART

A 2-wire bi-directional data bus, such as the Inter-Integrated Circuit ($I^2C$) data bus, is commonly used for communication between integrated circuit (IC) devices. Sometimes, a data bus must connect IC devices that are operating on different supply voltages. Thus, there is a need to provide fully bi-directional data transfer between a bus section that operates at a higher voltage and a bus section that operates at a lower voltage.

An $I^2C$ two-way data bus is normally pulled up to a positive supply voltage ("the bus voltage") by passive pull-up devices and relies on pull-down devices at the IC devices connected to the data bus to switch the voltage level on the bus for data transfer. FIG. 1 is a schematic diagram of a bi-directional data bus system operating based on the principles of the $I^2C$ standard and including two bus sections operating at different bus voltages. In FIG. 1, data bus system 10 includes a bus section BUS-A operating at a bus voltage $V_A$ and a bus section BUS-B operating at a bus voltage $V_B$. IC devices operating on a supply voltage of $V_A$ are connected to bus section BUS-A and IC devices operating on a supply voltage of $V_B$ are connected to bus section BUS-B.

Each bus section is connected to the respective positive supply voltage ($V_A$ or $V_B$) by a passive pull-up device, such as a resistor. Thus, when the data bus is free, the bus sections are at a logical HIGH level. When data is to be transferred on the data bus, output drivers of the IC devices connected to the data bus operate to pull-down the voltage on the data bus. Under the $I^2C$ standard, the output drivers of IC devices connected to the data bus must have an open-drain or open-collector pull-down device. As shown in FIG. 1, an open-drain pull-down transistor PD1, belonging to an output driver circuit of an IC device, is connected to bus section BUS-A and an open-drain pull-down transistor PD2, belonging to an output driver circuit of another IC device, is connected to bus section BUS-B.

When the two bus sections are operating at different bus voltages, some means of isolating IC devices connected to the bus and transferring the logic voltage levels between the bus sections is required. For example, an IC operating at 3.3 volts may need to communicate with another IC connected to the same data bus system and operating at 5.0 volts. U.S. Pat. No. 5,689,196 to Schutte describes an approach which uses a single transistor, such as a field effect transistor, to connect two bus sections with dissimilar voltages. FIG. 1 illustrates the use of the bi-directional level shifting approach described by Schutte in data bus system 10 for connecting bus sections with different supply voltages. In FIG. 1, a single N-channel enhancement MOS transistor 12 connects bus section BUS-A and bus section BUS-B. The gate terminal of transistor 12 is driven by the lower of the two bus voltages which is assumed to be bus voltage $V_A$. It can be seen that logic levels can be transferred in both directions of the data bus, independent of the supply voltages of the bus sections.

Although the bi-directional level shifting scheme described by Schutte is simple and works well, it imposes an additional requirement for the output drivers of IC devices connected to the data bus. Specifically, because the pull-down devices in the output drivers now have to drive an additional series resistance present by transistor 12, the pull-down devices must be substantially oversized to meet the pull-down requirements of the data bus system. For an $I^2C$ data bus system, the pull-down devices must be sized larger than the requirement of the $I^2C$ specification.

A more significant limitation of the bi-directional level shifting scheme described by Schutte is that it imposes a design constraint on IC devices to be connected to the data bus. IC designers must have a priori information regarding the additional drive requirement of the pull-down devices or the IC devices may not be designed with sufficient pull-down capabilities to drive the level-shifting FET. In the case of the $I^2C$ data bus system, a whole class of IC devices built to meet the minimum requirement of the $I^2C$ specification may not be able to work in a mix voltage data bus system utilizing the bi-directional level shifting scheme described by Schutte.

Therefore, an improved scheme for bi-directional level shifting on a data bus is desired.

SUMMARY OF THE INVENTION

According to one embodiment of the present invention, a circuit is provided to transfer data between a first data bus section operating on a first supply voltage and a second data bus section operating on a second supply voltage different from the first supply voltage. The circuit includes a first circuit path coupled to receive a data signal from the first data bus section and to drive the second data bus section and a second circuit path coupled to receive a data signal from the second data bus section and to drive the first data bus section. Each of the first and second circuit paths includes a delay circuit, a flip flop, a logic circuit providing an AND function and an output driver circuit.

The delay circuit is coupled to receive the respective data signal and to provide a first signal corresponding to the respective data signal, the delay circuit introducing a predetermined delay to the data signal only when the data signal has a first logical value. The flip flop includes a data input terminal, a data output terminal, an inverse data output terminal, a clock input terminal receiving the first signal, and a reset terminal receiving an inverse of the respective data signal. The data input terminal of the flip flop in one of the first and second circuit paths is coupled to the inverse data output terminal of the flip flop in the other one of the first and second circuit paths. The logic circuit providing an AND function, such as an AND gate, includes a first input terminal coupled to the data output terminal of the flip flop, a second input terminal coupled to the data input terminal of the flip flop, and an output terminal providing an output driver signal. Finally, the output driver circuit is coupled to drive the respective data bus section in response to the output driver signal.

In operation, when the data signal received on one of the first and second data bus sections has the first logical value, the output driver signal of the respective circuit path is asserted and the output driver circuit drives the other one of the first and second data bus sections to the first logical value in response to the output driver signal.

The present invention is better understood upon consideration of the detailed description below and the accompanying drawings.

DETAILED DESCRIPTION OF THE PREFERRED EMBODIMENTS

In accordance with the principles of the present invention, a bi-directional bus level translator implemented using only digital circuitry facilitates data transfer between data bus sections coupled to the bus level translator. The bus level translator is particularly useful when the bus sections coupled thereto are operated at different supply voltages. The bus level translator, powered by the lower one of the supply voltages or by a third voltage, operates to accurately transfer data signals from one bus section to another bus section and vice versa. A particular advantage of the bi-directional bus level translator is that no design constraint is placed on the output drivers of devices coupled to the bus sections. In other words, the bi-directional bus level translator of the present invention can be applied to any data bus systems where devices coupled thereto are designed only with the minimum requirement for the data bus system.

In one embodiment, the bi-directional bus level translator is applied in a data bus system operating according to the I²C standard. By using the bus level translator of the present invention, IC devices connected to a mixed voltage data bus system only need to include pull-down devices that meet the minimum drive requirement of the I²C standard. This is a marked improvement over the prior art where an oversized pull-down device is needed in an IC device to overcome the additional drive requirement of the level shifting FET.

Figure 1:
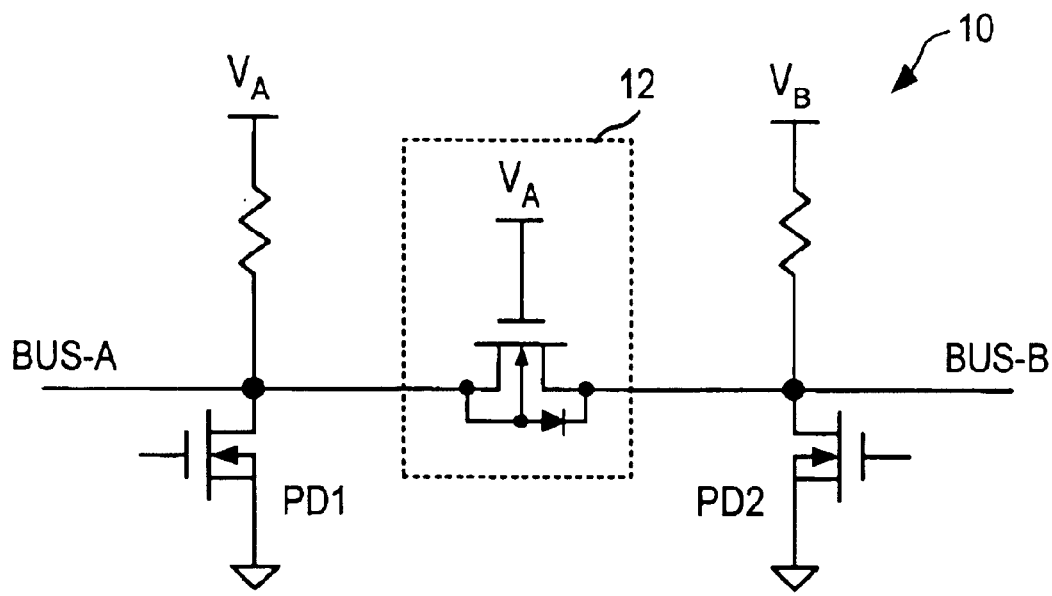
FIG. 1 is a schematic diagram of a bi-directional data bus system operating based on the principles of the I²C data bus and including two bus sections operating at different bus voltages.
Figure 2:
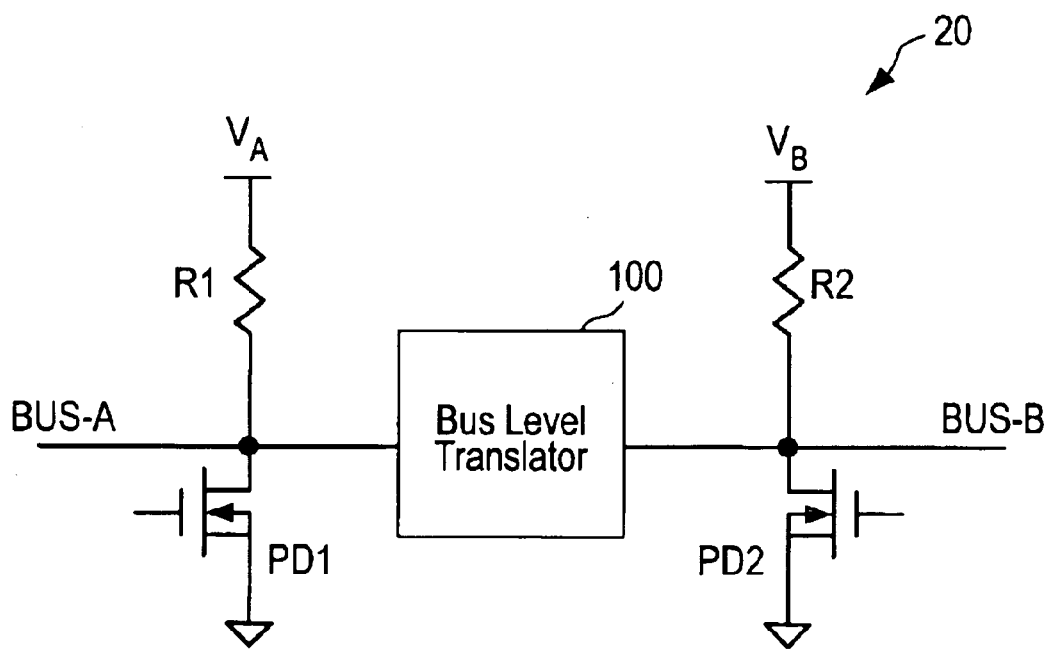
FIG. 2 is schematic diagram illustrating the incorporation of a bi-directional bus level translator according to the present invention in a bi-directional data bus system.

FIG. 2 is schematic diagram illustrating the incorporation of a bi-directional bus level translator according to the present invention in a bi-directional data bus system. Referring to FIG. 2, bi-directional bus level translator 100 is incorporated in a data bus system 20 similar to data bus system 10 of FIG. 1. Data bus system 20 includes a first bus section BUS-A operating at a bus voltage $V_A$ and a second bus section BUS-B operating at a bus voltage $V_B$ where voltage $V_A$ is lower than voltage $V_B$. IC devices operating on a supply voltage of $V_A$ are connected to bus section BUS-A and IC devices operating on a supply voltage of $V_B$ are connected to bus section BUS-B.

In one embodiment, bus level translator 100 is supplied by the bus voltage of the bus section with the lower supply voltage. In the present embodiment, bus voltage $V_A$ is assumed to be lower than bus voltage $V_B$. Thus, bus level translator 100 is supplied by a supply voltage of $V_A$. In another embodiment, bus level translator 100 can be supplied by a separate voltage, such as a battery voltage, independent of the supply voltages of the bus sections.

Data bus system 20 operates based on the principles of the I²C data bus. Thus, a pull-up device, resistor R1 or R2, is coupled to each bus section to pull the bus section up to the respective bus voltage. Thus, when the data bus is free or idle, the bus sections are at a logical HIGH level. To initiate data transfer, pull-down devices, such as transistors PD1 and PD2, associated with IC devices connected to the data bus operate to pull down the voltage of the respective bus section. Thus, when a pull-down device is activated, the respective bus section is at a logical LOW level and this logical LOW level is transmitted to other bus sections in data bus system 20 to effectuate data transfer.

In data bus system 20, bus level translator 100 of the present invention provides isolation between IC devices connected to bus sections operating at different supply voltages. More importantly, bus level translator 100 performs logic level translations and enables accurate data transfer between bus sections operating at different supply voltages. For example, when pull-down device PD1 is activated and bus section BUS-A is pulled to a logical LOW level, bus level translator 100 operates to pull down on bus section BUS-B so that the logical LOW level is transferred to bus section BUS-B. When pull-down device PD1 releases bus section BUS-A and resistor R1 pulls the bus voltage up to the positive supply voltage $V_A$, bus section BUS-A returns to a logical HIGH value. Bus level translator 100 of the present invention in turn causes a low-to-high transition to occur on bus section BUS-B to effectuate the data transfer.

Bus level translator 100 of the present invention does not present additional series resistance to the pull-down devices and therefore does not impose any constraint on the size of the pull-down devices that are coupled to the data bus system. When the bus level translator of the present invention is implemented in an I²C data bus system, the bus level translator realizes bi-directional level shifting functions and can work with IC devices incorporating pull-down devices that meet only the minimum requirements of the I²C specification.

Figure 3:
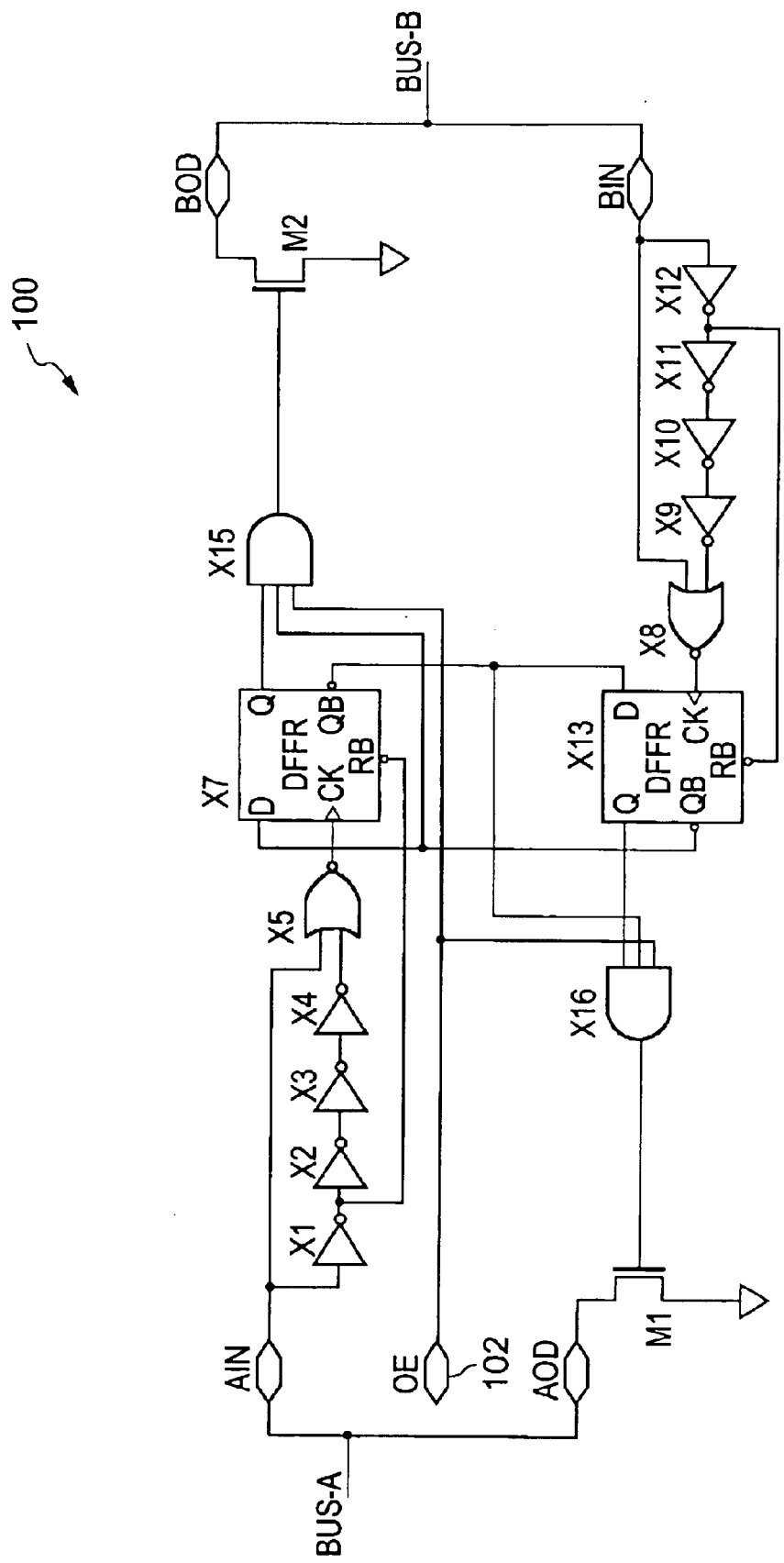
FIG. 3 is a schematic diagram of a bi-directional bus level translator according to one embodiment of the present invention.

FIG. 3 is a schematic diagram of a bi-directional bus level translator according to one embodiment of the present invention. Referring to FIG. 3, bi-directional bus level translator 100 includes a first input terminal AIN and a first output terminal AOD both coupled to a first bus section BUS-A. Bus level translator 100 also include a second input terminal BIN and a second output terminal BOD both coupled to a second bus section BUS-B. Bus section BUS-A operates at a bus voltage $V_A$ while bus section BUS-B operates at a bus voltage $V_B$. Bus sections BUS-A and BUS-B can be operated at the same or at different supply voltage levels. In the present description, bus sections BUS-A and BUS-B are assumed to be part of a mixed voltage data bus system. For example, BUS-A can be coupled to devices that are operating at a power supply voltage of 3.3V while BUS-B can be coupled to devices that are operating at a power supply voltage of 5V.

As described above, each bus section is coupled to a passive pull-up device to pull the bus voltage for that bus section up to the respective supply voltage when the bus section is free or idle. IC devices coupled to the bus sections include open-drain pull-down devices operating to pull the bus voltage of the respective bus section down to a logical low value when data transfer is desired. In operation, when one bus section is pulled to a logical low value, the other bus section should be pulled low in response to transfer data from one bus section to another. Bus level translator 100 operates to accurately transfer data signals between the bus sections, even when the bus sections are operating at different supply voltages.

Bus level translator 100 is bi-directional. Thus, when a data signal, such as a high-to-low transition, is being outputted on an output terminal, the input terminal of the same bus section would read the data signal (the high-to-low transition) as well. While an output terminal is outputting data signals, the logical transitions read by the associated input terminal cannot propagate to the output terminal of the other bus section where the data signal originates. For instance, if the high-to-low transition is allowed to pass through the bus level translator, a latched or locked condition can result where the bus section from which the data signal originates becomes latched or stuck at a logical low value. The bus level translator 100 of the present invention prevents erroneous detection of data signals at an input terminal when the associated output terminal is outputting data signals. In this manner, the bi-directional bus level translator of the present invention keeps the bus sections from latching up or locking up while providing bi-directional data transfer capability.

Bus level translator 100 includes a first circuit path coupled to the first input terminal and the second output terminal and a second circuit path coupled to the second input terminal and the first output terminal. In the present embodiment, bus level translator 100 has a symmetrical design and the first circuit path and the second circuit path are configured in the same manner. Generally, each circuit path includes a delay circuit, a D-flip flop, a logic circuit providing a logical AND function and an output driver circuit. The detailed construction of each circuit path will now be described.

Referring to FIG. 3, the first circuit path includes a delay circuit coupled to first input terminal AIN. The delay circuit includes a string of inverters X1 to X4 and a NOR gate X5. In the present embodiment, a string of inverters connected in series is used to provide the desired delay. In other embodiments, a string of inverting or non-inverting buffers connected in series can also be used. An input data signal received on first input terminal AIN is coupled to the input terminal of inverter X1 and also coupled directly to one of the input terminals of NOR gate X5. After passing through the string of inverters X1 to X4, the input data signal, delayed but with the same signal polarity, is coupled to the other input terminal of NOR gate X5. Because the bus sections are pulled to a logical high value when the bus sections are idle, the output signal of NOR gate X5 is normally at a logical low value. If bus section BUS-A is asserted, that is, a high-to-low transition is presented on first input terminal AIN, NOR gate X5 will transition to a logical high value after the delay provided by the string of inverters X1 to X4.

Following the delay circuit, the first circuit path includes a D-flip flop X7. D-flip flop X7 includes a reset terminal controlled by the inverse of the input data signal. That is, the output signal of inverter X1 drives the reset terminal RB of D-flip flop X7. In the present embodiment, the reset control of D-flip flop X7 is an active low signal. That is, D-flip flop X7 is reset when the signal driving the reset terminal RB is at a logical low value. When bus section BUS-A is idle, input terminal AIN is normally at a logical high value and the output of inverter X1 is therefore at a logical low value. Thus, when the bus section is idle, D-flip flop X7 is in reset. The data output terminal Q of D-flip flop X7 is at a logical low value while the inverse data output terminal QB is at a logical high value. When the bus section is asserted (a high to low transition at input terminal AIN), the reset control of the D-flip flop is first released by the low to high transition at the output terminal of inverter X1. Then, the output signal of NOR gate X5 is asserted (low-to-high transition) after the delay provided by inverters X1 to X4. Note that the same reset operation applies to D-flip flop X13 in the second circuit path as will be explained in more detail below.

The output signal of NOR gate X5 drives the clock input signal CK of D-flip flop X7. The data input signal D of D-flip flop X7 is the inverse data output signal QB of D-flip flop X13 in the second circuit path. When the clock input signal CK is asserted, that is when a data signal is presented on bus section BUS-A, the QB output of D-flip flop X13 is clocked through D-flip flop X7 and presented on the data output terminal of D-flip flop X7 as data output signal Q. As explained above, when a bus section is idle, the data output signal of the D-flip flop is at a logical low value while the inverse data output signal is at a logical high value. Thus, when a data signal is present on input terminal AIN and assuming that no data is present on input terminal BIN, the logical high value of the inverse data output signal QB of D-flip flop X13 is latched through D-flip flop X7 as the data output signal Q.

The data output signal Q from D-flip flop X7 drives one of the three input terminals of an AND gate X15. Besides the data output signal from D-flip Flop X7, AND gate X15 also receives the inverse data output signal QB of D-flip flop X13 (which is also the data input signal D of D-flip flop X7) and an output enable OE signal on a node 102. AND gate X15 provides a logical high value as output signal only when all of its input signals are at a logical high value. Thus, when OE is asserted (logical high) and when data signal is present on first input terminal AIN but not on second input terminal BIN, AND gate X15 will transition to a logical high value.

The output signal from AND gate X15 drives an output driver circuit which in the present embodiment includes an open-drain pull-down device M2. In the present embodiment, open-drain pull-down device M2 is implemented as an NMOS transistor. In other embodiments, an open-collector pull-down device, such as a NPN bipolar transistor, can be used. The output signal of AND gate X15 drives the gate terminal of NMOS transistor M2. When the output signal of AND gate X15 is asserted (low-to-high transition) in response to a data signal being present on first input terminal AIN, transistor M2 is turned on to pull second output terminal BOD down to a logical low value, such as the Vss or ground voltage. Thus, when input data signal is present at first input terminal AIN, transistor M2 is activated to pull down on second output terminal BOD to facilitate the data transfer from bus section BUS-A to bus section BUS-B.

To realize bi-directionality, bus level translator 100 includes a second circuit path constructed in the same manner as the first circuit path to facilitate data transfer in the opposite direction, that is, from bus section BUS-B to bus section BUS-A. In the present embodiment, the construction of the second circuit path is the same as the first circuit path. Referring to FIG. 3 again, the second circuit path includes a delay circuit coupled to second input terminal BIN. The delay circuit includes a string of inverters X9 to X12 and a NOR gate X8. An input data signal received on second input terminal BIN is coupled to the input terminal of inverter X12 and also coupled directly to one of the input terminals of NOR gate X8. After passing through the string of inverters X9 to X12, the input data signal, delayed but with the same signal polarity, is coupled to the other input terminal of NOR gate X8. The output signal of NOR gate X8 is normally at a logical low value. If bus section BUS-B is asserted, that is, a high-to-low transition is presented on second input terminal BIN, NOR gate X8 will transition to a logical high value after the delay provided by the string of inverters X9 to X12.

Following the delay circuit, the second circuit path includes a D-flip flop X13. D-flip flop X13 includes a reset terminal controlled by the inverse of the input data signal.

That is, the output signal of inverter X12 drives the reset terminal RB of D-flip flop X13. In the present embodiment, the reset control of D-flip flop X13 is an active low signal. When bus section BUS-B is idle, D-flip flop X13 is in reset. Accordingly, the data output terminal Q of D-flip flop X13 is at a logical low value while the inverse data output terminal QB is at a logical high value. When the bus section BUS-B is asserted (a high to low transition), the reset control of the D-flip flop is first released by the low to high transition at the output terminal of inverter X12 and then the output signal of NOR gate X8 is asserted (low-to-high transition) after the delay provided by inverters X9 to X12.

The output signal of NOR gate XB drives the clock input signal CK of D-flip flop X13. The data input signal D of D-flip flop X13 is the inverse data output signal QB of D-flip flop X7 in the first circuit path. When the clock input signal CK is asserted, that is when a data signal is presented on bus section BUS-B, the QB output of D-flip flop X7 is clocked through D-flip flop X13 and presented on the output terminal of D-flip flop X13 as data output signal Q. As explained above, when a bus section is idle, the data output signal of the D-flip flop is at a logical low value while the inverse data output signal is at a logical high value. Thus, when a data signal is present on input terminal BIN only and assuming that no data is present on input terminal AIN, the logical high value of the inverse data output signal QB of D-flip flop X7 is latched through D-flip flop X13 as the data output signal Q.

The data output signal Q from D-flip flop X13 drives one of the three input terminals of an AND gate X16. Besides the data output signal from D-flip Flop X13, AND gate X16 also receives the inverse data output signal QB of D-flip flop X7 (which is also the data input signal D of D-flip flop X13) and output enable OE signal on node 102. AND gate X16 provides a logical high value as output signal only when all of its input signals are at a logical high value. Thus, when OE is asserted (logical high) and when data signal is present on second input terminal BIN but not on first input terminal AIN, AND gate X16 will transition to a logical high value.

The output signal from AND gate X16 drives an output driver circuit which in the present embodiment includes an open-drain pull-down device M1. In the present embodiment, open-drain pull-down device M1 is implemented as an NMOS transistor. In other embodiments, an open-collector pull-down device, such as a NPN bipolar transistor, can be used. The output signal of AND gate X16 drives the gate terminal of NMOS transistor M1. When the output signal of AND gate X16 is asserted (low-to-high transition) in response to a data signal being present on second input terminal BIN, transistor M1 is turned on to pull the first output terminal AOD down to a logical low value, such as the Vss or ground voltage. Thus, when an input data signal is present at second input terminal BIN, transistor M1 is activated to pull down on first output terminal AOD to facilitate the data transfer from bus section BUS-B to bus section BUS-A.

The operation of bus level translator 100 of the present invention will now be described. Because bus level translator 100 is symmetrical in construction and provides fully bi-directional data transfer, it suffices to describe the data transfer operation of the bus level translator in one direction only. Data transfer in the opposite direction of the bus level translator will operate in the same manner.

First, the steady state condition of bus level transistor 100 will be described. In the present description, "steady state condition" refers to the state of bus level translator 100 when both bus sections are free or idle. When bus section BUS-A and bus section BUS-B are idle, both bus sections are pulled up to a logical high value by the passive pull-up device connected to each bus section (such as resistors R1 and R2 in FIG. 2). Bus section BUS-A is held at a bus voltage of $V_A$ and bus section BUS-B is held at a bus voltage of $V_B$. There is no requirement that the pull-up voltages of the two bus sections be the same. In fact, bus level translator 100 is adapted to work in a mixed voltage data bus systems where the two bus sections coupled thereto are operating on different supply voltages.

In the steady state condition, input terminals AIN and BIN both read a logical high value as input data signals. Thus, both input signals to NOR gates X5 and X8 are at a logical high value and the clock input signals CK of both D-flip flops X7 and X13 are at a logical low value. Furthermore, the reset terminals RB of both D-flip flops X7 and X13 are driven by the inverse of the input data signals and are therefore driven to a logical low value. Hence, both D-flip flops X7 and X13 are in reset. For both flip flops, the data output signal Q is at a logical low value while the inverse data output signal QB is at a logical high value. Since the QB output of one flip flop drives the data input terminal D of the other flip flop, the data input terminal D of each flip flop is driven by a logical high value.

Now, assume that a high-to-low transition occurs at first input terminal AIN. The high-to-low transition is coupled to NOR gate X5 and also to inverter X1. The logical low input data signal is inverted by inverter X1 and the inverted signal is coupled to the reset terminal RB of D-flip flop X7 to release the reset control of the D-flip flop. After the delay provided by inverter string X1 to X4, the output signal of NOR gate X5 will go high and the clock signal to D-flip flop X7 is asserted. D-flip flop X7 receives a logical high signal from D-flip flop X13 as input data signal D. The logical high signal is clocked through D-flip flop X7 and the data output signal Q will go to a logical high value.

In the present illustration, the output enable OE signal is assumed to have been asserted and is thus at a logical high value. AND gate X15 thus receives a logical high value from D-flip flop X7, a logical high OE signal and a logical high value from the QB output of D-flip flop X13. Accordingly, AND gate X15 asserts its output signal and a logical high value is provided to drive the gate terminal of pull-down device M2. Second output terminal BOD is then pulled to a logical low value and bus section BUS-B experience a high-to-low transition. In this manner, bus level translator 100 effectuates the transfer of the logical low input data signal from bus section BUS-A to bus section BUS-B.

As described above, because bus level translator 100 is bi-directional, the logical low signal appearing on bus section BUS-B, due to a data transfer from bus section BUS-A, can be read by the second input terminal BIN as a data signal from bus section BUS-B itself. If the data read by input terminal BIN is allowed to propagate through the bus level translator, a latching or locking up of the data buses can result. Bus level translator 100 of the present invention operates to prevent data at one output terminal (BOD or AOD) from feeding back on itself in the bus level translator so that latching or locking up of the data buses is avoided.

During a data transfer operation from bus section BUS-A to bus section BUS-B, the inverse data output signal QB of D-flip flop X7 which is at a logical low value is coupled to the data input terminal D of D-flip flop X13. Thus, even if the logical low value on second output terminal BOD is read by the second input terminal BIN as an input signal, causing the reset control on D-flip flop X13 to be released and the clock input signal to be asserted, the signal that is clocked through D-flip flop X13 is a logical low signal. D-flip flop X13 then presents a logical low signal as the Q output and a logical high signal as the QB output. In effect, the output logical state of D-flip flop X13 has not changed from the steady state condition even if the logical low value on output terminal BOD is read by input terminal BIN. The logical low value of the Q output of X13 will cause AND gate X16 to provide a logical low output signal and transistor M1 remains turned off. Thus, the data signal read by input terminal BIN does not propagate through bus level translator 100 and is not fed back to bus section BUS-A where the data signal originates.

When the IC devices driving BUS-A releases the bus, bus section BUS-A returns to a logical high value (such as the bus supply voltage VA). The low-to-high transition on input terminal AIN is coupled to NOR gate X5 and the output signal of NOR gate X5 transition to a logical low value without delay. The delay provided by inverters X1 to X4 applies only when the input data signal transitions from a logical high value to a logical low value. The clock input to D-flip flop X7 is then deasserted. The low-to-high transition on input terminal AIN is also coupled to inverter X1 which provides a logical low value to the reset terminal RB of D-flip flop X7, causing the D-flip flop to be put in reset. The Q output of D-flip flop X7 goes low, causing AND gate X15 to also go low. The control signal to pull-down device M2 is then deasserted and pull-down device M2 is turned off. Without the pull-down action of transistor M2, bus section BUS-B will transition high through the action of the passive pull-up device coupled to the bus section.

When bus level translator 100 is to be shut down, the output enable OE signal can be deasserted, that is, the OE signal can transition to a logical low value. In that case, regardless of the logical values at the input terminals AIN and BIN, the output signals of AND gates X15 and X16 will not be asserted and pull-down devices M1 and M2 will remain turned off. The incorporation of the output enable signal in bus level translator 100 is optional. If a shut down control is not needed, the output enable OE signal can be eliminated. AND gates X15 and X16 can be implemented as two-input AND gates receiving only the Q output from the associated D-flip flop and the QB output from the other D-flip flop.

In the situation where a high-to-low transition appears simultaneously on bus sections BUS-A and BUS-B, both D-flip flop X7 and D-flip flop X13 can get clocked simultaneously. In this situation, both input signal signals will be blocked from propagating through bus level translator 100 because neither AND gates will be asserted. As a result, bus level translator 100 prevents the circuit from latching into a stable state which is undesirable. In practice, even if the input data signal transitions on the bus sections is simultaneous, the circuit path where the input data signal propagates slightly faster will win and the input data signal from the slower circuit path will be locked out. Specifically, because AND gate X15 receives as input signals the Q output of D-flip flop X7, the output enable OE signal and the QB output of D-flip flop X13. The AND gate output will be asserted only if all three inputs are high. This is similarly true for AND gate X16. Thus, depending on the propagation of the input data signals on the first and second circuit paths, only one of the AND gates X15 and X16 will get turned on to drive one of the pull-down devices M1 or M2. Thus, latching of the bus level translator is prevented even when both bus sections are asserted.

In one embodiment, bus level translator 100 is applied in a data bus system applying the I²C standard. The I²C bus is a two wire data bus. Thus, one bus level translator will be used for the data wire while another bus level translator will be used for the clock wire. The bus level translator of the present invention can be used in a mixed voltage I²C data bus system. For example, BUS-A can be signaling between 0 to 3.3V and BUS-B can be signaling between 0 to 5V. As described, the bus level translator of the present invention can be powered by any power supply voltage that allows the logic to operate. Typically, the bus level translator is powered by the lower of the two bus supply voltages.

The above detailed descriptions are provided to illustrate specific embodiments of the present invention and are not intended to be limiting. Numerous modifications and variations within the scope of the present invention are possible. For example, in the above embodiments, specific logic gates have been employed to implement the bus level translator of the present invention. One of ordinary skill in the art would appreciate that other logic circuits or other combinations of logic gates can be used to implement the same logic functions. The use of specific logic gates in the above embodiments is illustrative only. Also, in the embodiment shown in FIG. 3, a string of four inverters is used to provide the desired delay. One of ordinary skill in the art would also appreciate that any number of inverters or non-inverting buffers can be used to provide the desired delay. The present invention is defined by the appended claims.

I claim:

1. A circuit coupled to transfer data between a first data bus section operating on a first supply voltage and a second data bus section operating on a second supply voltage different from the first supply voltage, the circuit comprising:

a first circuit path coupled to receive a data signal from the first data bus section and to drive the second data bus section; and a second circuit path coupled to receive a data signal from the second data bus section and to drive the first data bus section, wherein each of the first and second circuit paths comprises:

a delay circuit coupled to receive the respective data signal and to provide a first signal corresponding to the respective data signal, the delay circuit introducing a predetermined delay to the data signal only when the data signal has a first logical value;

a flip flop comprising a data input terminal, a data output terminal, an inverse data output terminal, a clock input terminal receiving the first signal, and a reset terminal receiving an inverse of the respective data signal, wherein the data input terminal of the flip flop in one of the first and second circuit paths is coupled to the inverse data output terminal of the flip flop in the other one of the first and second circuit paths;

a logic circuit providing an AND function and comprising a first input terminal coupled to the data output terminal of the flip flop, a second input terminal coupled to the data input terminal of the flip flop, and an output terminal providing an output driver signal; and an output driver circuit being coupled to drive the respective data bus section in response to the output driver signal, wherein when the data signal received on one of the first and second data bus sections has the first logical value, the output driver signal in the respective first or second circuit path is asserted and the output driver circuit of the respective first or second circuit path drives the other one of the first and second data bus sections to the first logical value in response to the output driver signal.

2. The circuit of claim 1, wherein the logic circuit providing an AND function in each of the first and second circuit paths further comprises a third input terminal coupled to receive an output enable signal, the output enable signal operating to activate the first and second circuit paths.

3. The circuit of claim 1, wherein the delay circuit in each of the first and second circuit paths comprises:
   a first terminal coupled to receive the respective data signal;
   a second logic circuit providing an NOR function, the second logic circuit having a first input terminal coupled to the first terminal and a second input terminal; and
   a plurality of buffers connected in series between the first terminal and the second input terminal of the second logic circuit,
   wherein the second logic circuit includes an output terminal providing the first signal.

4. The circuit of claim 3, wherein the plurality of buffers comprises an even number of inverters connected in series between the first terminal and the second input terminal of the second logic circuit.

5. The circuit of claim 4, wherein the reset terminal of the flip flop in each of the first and second circuit paths receives the inverse of the respective data signal from the even number of inverters, the inverse of the respective data signal being generated by an odd number of inverters.

6. The circuit of claim 1, wherein the output driver circuit comprises a transistor having a control terminal receiving the output driver signal, a first current handling terminal coupled to drive the respective data bus section and a second current handling terminal coupled to a third supply voltage.

7. The circuit of claim 6, wherein the transistor comprises an N-type MOS field effect transistor.

8. The circuit of claim 6, wherein the output driver circuit of the first circuit path comprises a transistor having a control terminal receiving the output driver signal, a first current handling terminal coupled to drive the second data bus section and a second current handling terminal coupled to the third supply voltage.

9. The circuit of claim 6, wherein the output driver circuit of the second circuit path comprises a transistor having a control terminal receiving the output driver signal, a first current handling terminal coupled to drive the first data bus section and a second current handling terminal coupled to the third supply voltage.

10. The circuit of claim 6, wherein the third supply voltage comprises a ground potential.

11. The circuit of claim 1, wherein the first supply voltage is lower than the second supply voltage and the first circuit path and the second circuit path are supplied by the first supply voltage.

12. The circuit of claim 1, wherein the data signal comprises a logical low value being the first logical value and a logical high value, the first and second data bus sections being pulled to a third supply voltage lower than the first and the second supply voltages to indicate the logical low value and being pulled to the respective first and second supply voltages to indicate the logical high value.

13. The circuit of claim 12, wherein the first data bus section and the second data bus section are pulled to the respective first and second supply voltage by passive pull-up devices, the first data bus section and the second data bus section being pulled down to the third supply voltage to generate a data signal having the first logical value.

14. A method for transferring data from a first data bus section being operated on a first supply voltage and to a second data bus section being operated on a second supply voltage different from the first supply voltage, the method comprises:
   providing a first circuit path coupled to receive a data signal from the first data bus section and to drive the second data bus section; and
   providing a second circuit path coupled to receive a data signal from the second data bus section and to drive the first data bus section,
   wherein at each of the first and second circuit paths, the method comprises:
      generating a first signal corresponding to the data signal received from the respective data bus section, the first signal including a predetermined delay when the data signal has a first logical value;
      providing a flip flop receiving a data input signal, a clock input signal and a reset signal, and providing a data output signal and an inverse data output signal;
      coupling the first signal to the flip flop as the clock input signal;
      coupling the inverse data output signal from the flip flop in the other one of the first and second circuit paths as the data input signal;
      coupling an inverse of the data signal as the reset signal;
      performing a logical AND operation on the data input signal and the data output signal of the flip flop, the logical AND operation generating an output driver signal; and
      driving the other one of the first and second data bus sections in response to the output driver signal.

15. The method of claim 14, wherein when the data signal received on one of the first and second data bus sections has the first logical value, the act of driving the respective data bus section in response to the output driver signal comprises:
   asserting the output driver signal;
   driving the respective data bus section to the first logical value in response to the output driver signal.

16. The method of claim 15, wherein the act of driving the respective data bus section to the first logical value in response to the output driver signal comprises:
   coupling an open drain pull-down device to the respective data bus section to be driven; and
   turning on the pull-down device in response to the output driver signal,
   wherein as a result of turning on the pull-down device, the respective data bus section to be driven is pulled down to a third supply voltage lower than the first and second supply voltages.

17. The method of claim 15, wherein the data signal comprises a logical low value being the first logical value and a logical high value, the first and second data bus sections being pulled to a third supply voltage lower than the first and the second supply voltages to indicate the logical low value and being pulled to the respective first and second supply voltages to indicate the logical high value.

18. The method of claim 17, further comprises:
driving the first and second data bus sections to the respective first and second supply voltages using passive pull-up devices; and
driving a respective one of the first and second data bus sections to the third supply voltage to generate a data signal having the first logical value.

19. The method of claim 14, wherein the act of performing a logical AND operation comprises performing a logical AND operation on the data input signal, the output signal of the flip flop and an output enable signal, and generating the output driver signal, the output enable signal operating to activate the first and second circuit paths.

20. The method of claim 14, wherein the act of generating a first signal corresponding to the data signal received from the respective data bus section comprises:
coupling the data signal to a delay circuit;
generating a delayed data signal having a logical value corresponding to the data signal;
performing a logical NOR operation on the data signal and the delayed data signal; and
generating the first signal as a result of the logical NOR operation.

* * * * *